(12) United States Patent
Ito

(10) Patent No.: US 6,998,339 B2
(45) Date of Patent: Feb. 14, 2006

(54) METHOD OF FORMING CONDUCTOR WIRING PATTERN

(75) Inventor: Daisuke Ito, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 10/657,193

(22) Filed: Sep. 9, 2003

(65) Prior Publication Data

US 2004/0048465 A1    Mar. 11, 2004

(30) Foreign Application Priority Data

Sep. 11, 2002   (JP)   ............................. 2002-265227

(51) Int. Cl.
*H01L 21/4763*   (2006.01)

(52) U.S. Cl. ...................... 438/622; 438/637; 438/643

(58) Field of Classification Search ................ 438/618, 438/622, 623, 637, 678, 643
See application file for complete search history.

(56) References Cited

U.S. PATENT DOCUMENTS

| | | | |
|---|---|---|---|
| 4,624,749 A | * | 11/1986 | Black et al. .................. 205/50 |
| 5,209,817 A | * | 5/1993 | Ahmad et al. ................. 216/18 |
| 6,080,656 A | * | 6/2000 | Shih et al. .................... 438/626 |
| 6,200,888 B1 | | 3/2001 | Ito et al. ...................... 438/597 |
| 2004/0166659 A1 | * | 8/2004 | Lin et al. .................... 438/611 |

FOREIGN PATENT DOCUMENTS

| | | |
|---|---|---|
| JP | 2001-053075 | 2/2001 |
| JP | 2001-127095 | 5/2001 |

* cited by examiner

*Primary Examiner*—Trung Dang
(74) *Attorney, Agent, or Firm*—Staas & Halsey LLP

(57) ABSTRACT

A method of forming a conductor wiring pattern comprises: forming a first insulating layer on a surface of a semiconductor wafer and also forming a second, photosensitive insulating resin layer thereon; light-exposing and developing the second insulating layer to form pattern grooves so that the first insulating layer is exposed at bottoms of the pattern grooves; forming a plating seed layer on the second insulating layer including inner surfaces of the pattern grooves and then forming a resist pattern on the seed layer except for portions of the pattern grooves; filling the pattern grooves with a conductor by an electrolytic plating using the seed layer as a power supply layer; and removing the resist pattern and also removing the seed layer exposed on the surface of the second insulating layer to form a wiring pattern consisting of conductors remaining in the pattern grooves.

9 Claims, 5 Drawing Sheets

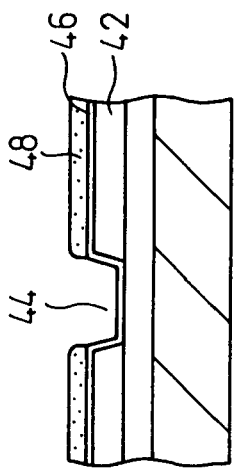
Fig.1(a)
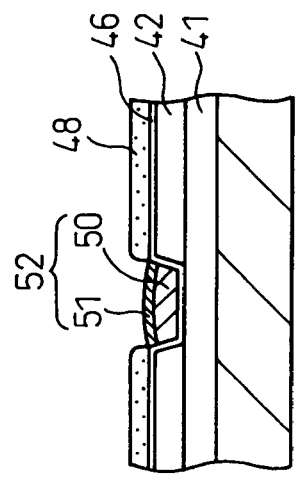
Fig.1(b)
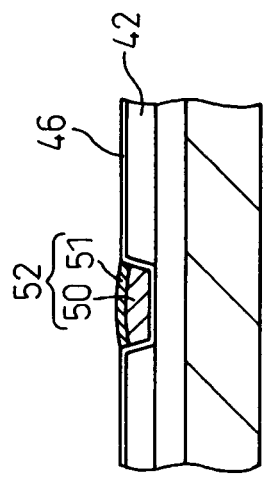
Fig.1(c)
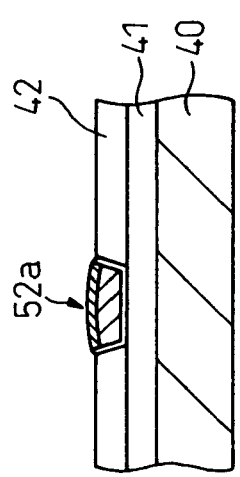
Fig.1(d)
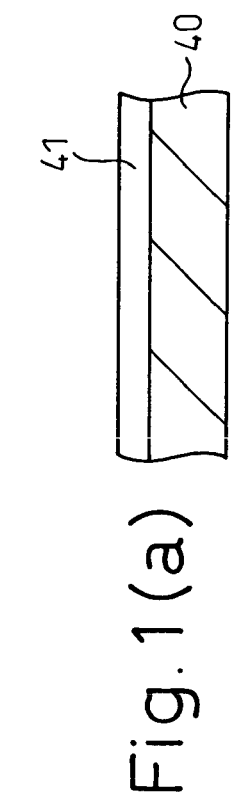
Fig.1(e)
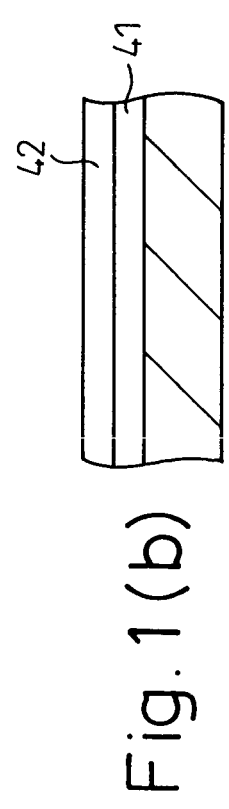
Fig.1(f)
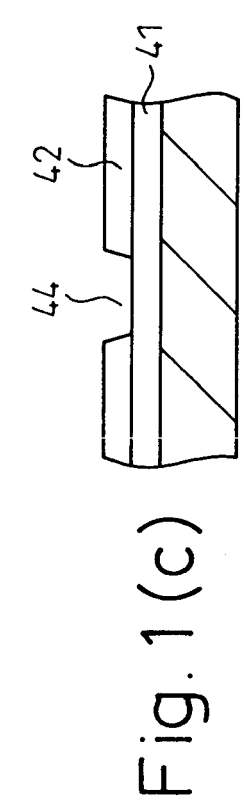
Fig.1(g)
Fig.1(h)

METHOD OF FORMING CONDUCTOR WIRING PATTERN

BACKGROUND OF THE INVENTION

1. Field of the Invention

The present invention relates to a method of forming wiring. More particularly, the present invention relates to a method of forming wiring for electronic parts such as a semiconductor wafer, a wiring substrate and the like.

2. Description of the Related Art

There is provided a method of manufacturing a semiconductor device in which a rewiring pattern is formed on an electrode terminal formation face of a semiconductor wafer, an external connecting terminal is connected to the rewiring pattern and the semiconductor wafer is diced to individual pieces. FIG. 5 is a view showing a structure in which the face of the semiconductor wafer 10, on which the electrode terminal 12 is formed, is covered with the insulating layer 14, and the rewiring pattern 16, which is electrically connected to the electrode terminal 12, is formed on a surface of the insulating layer 14. Reference numeral 18 is a solder ball used as an external connecting terminal.

In the above method of manufacturing a semiconductor device, as it is necessary to form a fine rewiring pattern 16, a so-called "semi-additive" method by which a fine wiring can be formed is adopted so as to form the rewiring pattern 16.

FIGS. 6(a) to 6(e) are views showing a conventional method in which the rewiring pattern 16 is formed by the semi-additive method. Concerning the method of forming the rewiring pattern, refer to the U.S. Pat. No. 6,200,888 (corresponding to Japanese Unexamined Patent Publication No. 2001-28371), Japanese Unexamined Patent Publication No. 2001-127095 and Japanese Unexamined Patent Publication No. 2001-53075. FIG. 6(a) is a view showing a state in which an electrode formation face of the semiconductor wafer 10 is covered with the insulating layer 14 made of polyimide and the surface of the insulating layer 14 is coated with a seed layer 20 used for plating. The seed layer 20 can be formed by means of sputtering copper. In this connection, in order to improve the adhesion property of the wiring pattern to the insulating layer 14, chromium having an excellent adhesion property with respect to the insulating layer 14 is first sputtered and then copper is sputtered so as to form the seed layer 20.

FIG. 6(b) is a view showing a state of forming the resist pattern 22 on which the seed layer 20 is exposed. This seed layer 20 is formed, in a portion in which the wiring pattern is to be formed, by coating a surface of the seed layer 20 with photosensitive resist and exposing and developing it. Reference numeral 20a is an exposed portion of the seed layer 20.

FIG. 6(c) is a view showing a state in which electrolytic copper plating is performed when the seed layer 20 is used as an electricity feeding layer for plating, and the conductor 24 (copper plating), the width t of which is approximately 8μ, is formed by being heaped up in the exposed portion 20a. FIG. 6(d) is a view showing a state in which the resist pattern 22 is removed and the seed layer 20 coated with the resist pattern 22 is exposed. FIG. 6(e) is a view showing a state in which the seed layer 20, exposed onto the surface of the insulating layer 14, is etched so that the rewiring pattern 16 is formed.

FIGS. 7(a) to 7(c) are views showing a conventional example in which, after the conductor 24 has been heaped up in the exposed portion 20a on the seed layer 20, nickel plating is performed when the seed layer 20 is used as an electricity feeding layer so as to form a barrier layer 26. FIG. 7(a) is a view showing a state in which the barrier layer 26 is formed on a surface of the conductor 24. FIG. 7(b) is a view showing a state in which the resist pattern 22 is removed. FIG. 7(c) is a view showing a state in which the seed layer 20, formed on the surface of the insulating layer 14 and exposed to the outside, is removed and the rewiring pattern 16 is formed.

In the above case in which the rewiring pattern 16 is formed on the electrode terminal formation face of the semiconductor wafer, in the case where the wiring pattern is formed by the semi-additive method, the seed layer is provided and then the conductor, which becomes a wiring pattern, is formed and an unnecessary portion of the seed layer is removed by means of etching. In the above example, the seed layer 20 exposed onto the surface of the insulating layer 14 is removed by means of etching. The thickness of the seed layer 20 is approximately 1 μm or less, that is, the thickness of the seed layer 20 is very small. This means that the seed layer 20 can be easily removed by means of etching. Nevertheless, when the seed layer 20 is removed, the seed layer 20 is etched without coating the conductor 24 and the barrier layer 26 with resist or the like. The reason is that even when etching is conducted without protecting the conductor 24 by resist or the like, no problems are caused in the finished profile of the wiring pattern.

However, in the case where the pattern width and pattern interval of the rewiring pattern, which is to be formed on the electrode terminal formation face of the semiconductor wafer, and the pattern width and pattern interval of the wiring pattern, which is to be formed on the wiring substrate, become very small, such as not more than 20 μm, that is, in the case where the pattern width and pattern interval of the rewiring pattern and the wiring pattern are very fine, it becomes impossible to neglect that the conductor, which becomes a wiring pattern, is etched simultaneously when the seed layer is etched. Therefore, it becomes impossible to form a wiring pattern of predetermined finished accuracy.

FIGS. 8(a) and 8(b) are views showing a state in which the seed layer 20 and the conductor 24, which becomes a wiring pattern, are etched in the case of forming the wiring pattern by etching the seed layer 20. A broken line shows a position of the side of the conductor 24 before etching is conducted. FIG. 8(a) shows a case in which the seed layer 20 and the conductor 24 are provided, and FIG. 8(b) shows a case in which the seed layer 20, the conductor 24 and the barrier layer 26 are provided.

When the seed layer 20 is etched, an outer surface of the conductor 24 is exposed to an etchant and etched. In this case, there is a tendency for the lower layer side to be eroded as compared with the upper layer. Accordingly, as shown in the drawing, etching is performed in such a manner that the width of the seed layer 20 is reduced more than the width of the conductor layer 24. Therefore, even when the conductor 24 is etched to a predetermined width, the seed layer 20 is excessively etched. In the case shown in FIG. 8(b) in which the conductor 24 and the barrier layer 26 are made of different metals, the degree of erosion caused by etching on each layer is different. Therefore, a profile of the side of the wiring pattern cannot be formed uniformly.

As described above, the action of erosion caused by etching on the side of the conductor 24 in the case of etching the seed layer 20 cannot be neglected in the case of the wiring pattern, the pattern width of which is small, that is, the pattern width of which is not more than 20 μm. Accordingly, there is caused a problem that the wiring pattern is over-etched and the pattern width cannot be finished to a predetermined size. In the case where etching is controlled so that the wiring pattern cannot be over-etched, when intervals of the seed layer 20 between the wiring patterns are decreased, the seed layer between the wiring patterns cannot be completely etched and the wiring patterns are electrically short-circuited.

The above problems are caused when very fine wiring patterns are formed on the wiring substrate by the semi-additive method.

SUMMARY OF THE INVENTION

The present invention has been accomplished to solve the above problems. It is an object of the present invention to provide a method of forming wiring capable of solving the problem that, when a semiconductor device or a wiring substrate is formed, the width of a wiring pattern deviates from a predetermined size and the position of the wiring pattern is shifted from a previously designed position. Therefore, the method of forming wiring of the present invention can positively form a highly accurate wiring pattern even when a very fine wiring pattern is formed.

According to the present invention, there is provided a method of forming a conductor wiring pattern, comprising the following steps of: forming a first insulating layer on a surface of a substrate and also forming a second, photosensitive insulating resin layer thereon; light-exposing and developing the second insulating layer to form a pattern of grooves so that the first insulating layer is exposed at bottoms of the patterned grooves; forming a plating seed layer on the second insulating layer including inner surfaces of the patterned grooves and then forming a resist pattern on the plating seed layer except for portions of the pattern grooves; filling the pattern grooves with a conductor by an electrolytic plating using the plating seed layer as a power supply layer; and removing the resist pattern and also removing the seed layer exposed on the surface of the second insulating layer to form wiring pattern consisting of conductors remained in the pattern grooves.

A plurality of different metal layers are used as the conductor, when the pattern grooves are filled with the conductor by the electrolytic plating. The plurality of different metal layers are at least two metal layers consisting of a copper base layer and a nickel barrier layer.

The first insulating layer is composed of a photosensitive insulating resin; after the first insulating layer is light-exposed and developed to form an opening, through which a first wiring pattern formed on the substrate is to be electrically connected to a second wiring pattern to be formed on the first insulating layer, the first insulating layer is heated and hardened.

A semiconductor wafer is used as the substrate, the semiconductor wafer has an electrode terminal forming surface, on which the first insulating layer and the second insulating layer are formed, and the wiring pattern which electrically connected with electrode terminals of the semiconductor wafer is formed.

BRIEF DESCRIPTION OF THE DRAWINGS

FIGS. 1(a) to 1(h) are schematic illustrations showing a method of forming wiring of the present invention;

DETAILED DESCRIPTION OF THE PREFERRED EMBODIMENTS

Figure 2:
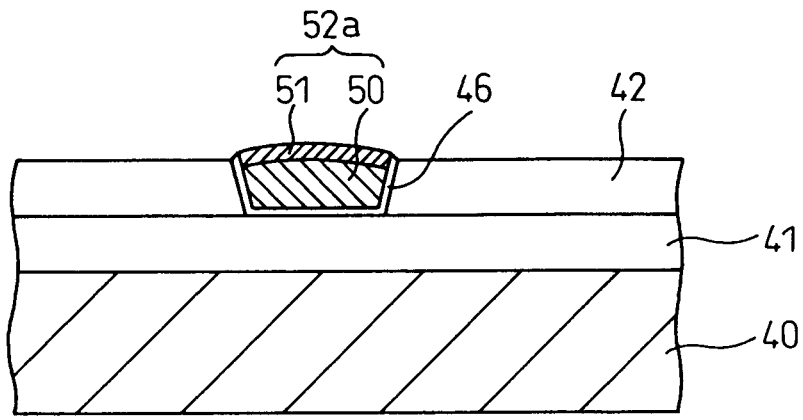
FIG. 2 is an enlarged sectional view showing the formation of a wiring pattern.

Referring to the accompanying drawings, preferred embodiments of the present invention will be explained in detail as follows.

FIGS. 1(a) to 1(h) are schematic illustrations showing a method of forming wiring of the present invention, i.e., a basic manufacturing process of forming a wiring pattern on a substrate 40 such as a semiconductor wafer or a wiring substrate. The method of forming wiring of the present invention is characterized in that: when a wiring pattern is formed on a semiconductor wafer or substrate such as a wiring substrate, the wiring pattern is formed by using an insulating layer composed of a two layer structure including a first and a second insulating layer.

FIG. 1(a) is a view showing a state in which the first insulating layer 41 is formed on a surface of the substrate 40. The insulating layer 41 can be formed by laminating a photosensitive resin film (for example, a polyimide film). The first insulating layer 41 is provided for the object of electrically insulating electrode terminals and wiring patterns, which are arranged on the substrate 40, from wiring patterns formed above the substrate 40. When necessary, on the first insulating layer 41, there are provided openings for electrically connecting the electrode terminals or the wiring patterns, which are formed on a surface of the substrate, with the wiring patterns which are formed on a surface of the first insulating layer. After predetermined processing has been conducted on the first insulating layer 41, it is heated and hardened.

FIG. 1(b) is a view showing a state in which the second insulating layer 42 is formed on a surface of the first insulating layer 41. The second insulating layer 42 is formed by laminating a photosensitive film made of a resin such as polyimide. In this connection, both the first insulating layer 41 and the second insulating layer 42 can be formed by laminating resin films. Except for that, the first insulating layer 41 and the second insulating layer 42 can also be formed when photosensitive resin having an electrical insulating property is coated by a predetermined thickness. That is, the method of forming the first insulating layer 41 and the second insulating layer 42 is not restricted to the above specific embodiment.

FIG. 1(c) is a view showing a state in which the second insulating layer 42 is exposed and developed and the pattern groove 44 is formed according to a predetermined wiring pattern to be formed on a surface of the first insulating layer 41. In this connection, FIG. 1(c) is a view showing a cross section taken in the direction perpendicular to the longitudinal direction of the wiring pattern. Since the first insulating layer 41 has been heated and hardened, when the second insulating layer 42 is exposed and developed, only the second insulating layer 42 is patterned, and the first insulating layer 41 is exposed onto the bottom face of the pattern groove 44.

FIG. 1(d) is a view showing a state in which the seed layer 46 used for plating is formed on the surface of the second insulating layer 42 including the inner face of the pattern groove 44. The seed layer 46 is formed so that it can be used as an electricity feeding layer for plating. Therefore, the thickness of the seed layer 46 may be small, that is, the thickness of the seed layer 46 may be formed so that it cannot be more than 1 µm. The seed layer 46 can be formed by the method of electroless plating, sputtering, vapor-deposition or the like.

FIG. 1(e) is a view showing a state in which photosensitive resist is coated on the surface of the seed layer 46 and then exposed and developed so as to form the resist pattern 48 from which a portion (pattern groove) on the surface of the seed layer 46, in which the wiring pattern is to be formed, is exposed.

FIG. 1(f) is a view showing a state in which electrolytic copper plating and electrolytic nickel plating are conducted in this order while the seed layer 46 is used as an electricity feeding layer for plating, so that the conductor 52 including the copper plating layer 50 and the barrier layer 51 composed of the nickel plating layer can be formed in the pattern groove 44. The copper plating layer 50 is formed so that the copper plated portion can be heaped up in the pattern groove 44 by electrolytic plating in which the seed layer 46 is used as an electricity feeding layer for plating.

The conductor 52 formed in the pattern groove 44 is formed in such a manner that the copper plating is heaped up to substantially the same thickness as that of the second insulating layer 42 or the copper plating is heaped up to double the thickness of the second insulating layer. In other words, the second insulating layer 42 is formed to the substantially same thickness as that of the wiring pattern to be formed or the second insulating layer 42 is formed to half the thickness of the wiring pattern to be formed.

FIG. 1(g) is a view showing a state in which the resist pattern 48 is removed so that the seed layer 46 on the surface of the second insulating layer 42 is exposed to the outside. FIG. 1(h) is a view showing a state in which the seed layer 46 on the surface of the second insulating layer 42 is removed by means of etching and the wiring pattern 52a including the conductor 52, composed of the copper plating layer 50 and the barrier layer 51, is formed.

Since the thickness of the seed layer 46 is much smaller than that of the conductor 52 filled into the pattern groove 44, when the seed layer 46 is removed by means of etching, etching may be conducted without protecting the conductor 52, which is filled into the pattern groove 44, by resist or the like.

FIG. 2 is an enlarged view of the wiring pattern 52a shown in FIG. 1(h). According to the wiring formation method of this embodiment, as the seed layer 46 is etched under the condition that the conductor 52 is filled into the pattern groove 44, when the seed layer 46 is etched, a side portion of the conductor 52 is protected by the second insulating layer 42 and is not exposed outside. Therefore, the side of the conductor 52 is not eroded by an etchant used in the process of etching. Accordingly, the wiring pattern 52a is formed according to the shape of the pattern groove 44 formed on the second insulating layer 42. There is no possibility that the width of the conductor 52 fluctuates or that the cross section of the conductor 52 is not formed uniformly in the process of etching the seed layer 46. Even when the conductor 52 is composed of laminations of different metals as in a case in which the conductor 52 composing the wiring pattern 52a is provided with the barrier layer 51, there is no possibility that the formation accuracy of the wiring pattern 52a is lowered.

According to the wiring formation method of this embodiment, the accuracy of the finished wiring pattern 52a is determined by the accuracy of the pattern groove 44 formed by exposing and developing the second insulating layer 42.

In the case of forming the wiring pattern by the semi-additive method, as shown in FIGS. 6(a) to 6(e), the photosensitive resist is exposed and developed so as to form the resist pattern 22, and then the conductor 24 is formed in the exposure portion 20a on the seed layer 20 heaped up by means of plating. Therefore, the thickness of the photosensitive resist is larger than that of the conductor 24. On the other hand, the thickness of the second insulating layer 42 used in the wiring formation method of this embodiment is the same as that of the wiring pattern 52a or smaller than the thickness of the wiring pattern 52a. Therefore, the accuracy of the pattern groove 44 in the case of exposing and developing the second insulating layer 42 is higher than the accuracy of the conventional wiring pattern which is formed by exposing and developing the resist. Therefore, according to the present embodiment, it is possible to form a wiring pattern finer than that formed by the conventional semi-additive method.

Since the conductor 52 forming the wiring pattern 52a is filled into and held by the pattern groove 44, it can be stably held. Therefore, even when a very fine wiring pattern, the pattern width and the pattern interval of which are respectively not more than 20 µm, is formed, it is possible to prevent the occurrence of short circuit of the wiring pattern 52a and form a highly accurate wiring pattern.

FIGS. 3(a) to 3(f) are views showing a method of forming a semiconductor device by utilizing the rewiring pattern 16 on the electrode terminal formation face of the semiconductor wafer 10 by the wiring formation method described above.

Figure 3A:
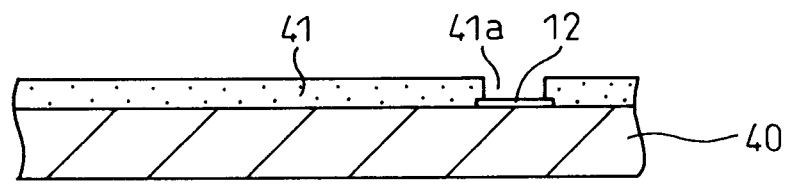
FIGS. 3(a) to 3(f) are schematic illustrations of forming a rewiring pattern on an electrode terminal formation face of a semiconductor wafer by a method of forming wiring of the present invention.

FIG. 3(a) is a view showing a state in which the first insulating layer 41 is formed on the electrode terminal formation face of the semiconductor wafer 40. In order to electrically connect the rewiring pattern with the electrode terminal 12, the opening hole 41a is formed on the first insulating layer 41 agreeing with a position at which the electrode terminal 12 is arranged. The first insulating layer 41 is formed in such a manner that, for example, a photosensitive resin film is laminated and exposed and developed so as to form the opening 41a, and then the resin film is heated and hardened.

Figure 3B:
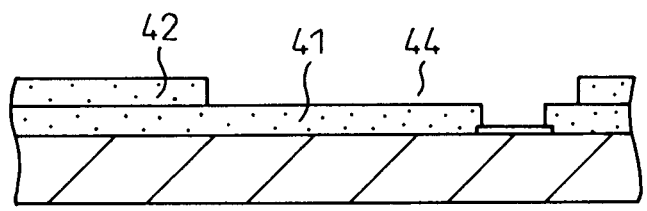

FIG. 3(b) is a view showing a state in which the second insulating layer 42 is formed on the first insulating layer 41 and exposed and developed so as to form the pattern groove 44 for forming the rewiring pattern. A surface of the first insulating layer 41 is exposed onto the bottom face of the pattern groove 44. The view is taken from a direction parallel with the longitudinal direction of the rewiring pattern.

Figure 3C:
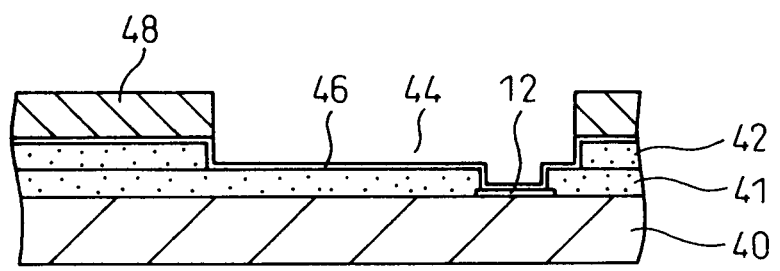

FIG. 3(c) is a view showing a state in which the seed layer 46 used for plating is formed by means of sputtering of copper and the resist pattern 48 is formed so that a portion (pattern groove) on the seed layer 46, in which the wiring pattern is formed, can be exposed. The seed layer 46 is formed so that the inner face of the pattern groove 44, the inner face of the opening 41a and the surface of the second insulating layer 42 can be coated with the seed layer 46. In order to improve the adhesion property of the first insulating layer 41 to the wiring pattern, it is possible to adopt a method in which chromium is first sputtered and then copper is sputtered so that two layer structure is formed on the seed layer 46. The seed layer 46 is formed so that the thickness can be very small, that is, the seed layer 46 is formed so that the thickness can be not more than 1 µm.

Figure 3D:
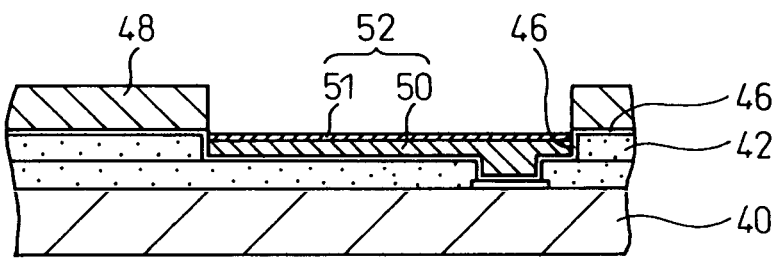

FIG. 3(d) is a view showing a state in which electrolytic copper plating is conducted while the seed layer 46 is being used as an electricity feeding layer for plating and the copper plating layer 50 is heaped up by plating in an exposed portion of the seed layer 46. The thickness of the copper plating layer 50 is determined to be a value at which the pattern groove 44 is filled with the copper plating layer 50. Reference numeral 51 is a barrier layer provided so that it can coat a surface of the copper plating layer 50. As described above, a primary portion of the conductor 52 filled into the pattern groove 44 is composed of the copper plating layer 50 and the barrier layer 51. In this connection, the barrier layer 51 is appropriately provided, and the metal used for the barrier layer 51 may be appropriately selected.

Figure 3E:
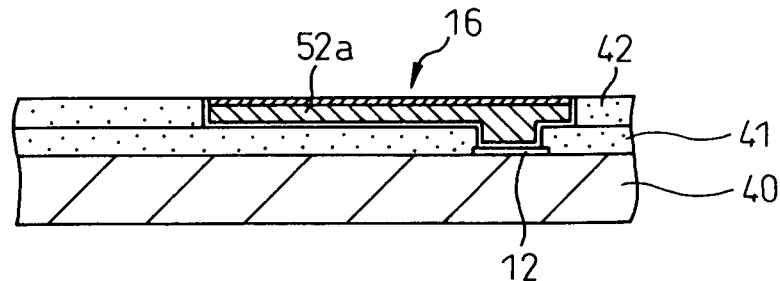

FIG. 3(e) is a view showing a state in which the resist pattern 48 is removed and the seed layer 46 exposed onto the surface of the second insulating layer 42 is removed by means of etching so that the wiring pattern 52a is formed. In the pattern groove 44, the wiring pattern 52a composed of the conductor 52 is formed, that is, the rewiring pattern 16 is formed. The rewiring pattern 16 is formed on a surface of the first insulating layer 41 under the condition that the rewiring pattern 16 is electrically connected with the electrode terminal 12 of the semiconductor wafer 10.

Figure 3F:
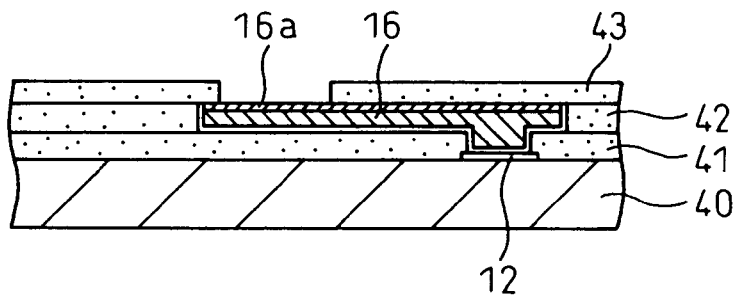

FIG. 3(f) is a view showing a state in which a face, on which the rewiring pattern 16 is formed, is coated with the protective film 43 made of solder resist and the land 16a to be connected with the external connecting terminal is exposed onto the outlet end side of the rewiring pattern 16. When the land 16a is connected with an external connecting terminal such as a solder ball, it is possible to provide a semiconductor device in which the electrode terminal 12 and the external connecting terminal are electrically connected with each other via the rewiring pattern 16.

In this embodiment, the conductor 52 is filled into the pattern groove 44 provided on the second insulating layer 42. When the exposed portion on the seed layer 46 is etched, the side of the conductor 52 is protected by the second insulating layer 42, so that it is not exposed outside. Therefore, the rewiring pattern 16 can be formed according to the profile of the pattern groove 44 provided on the second insulating layer 42. Accordingly, even when a very fine rewiring pattern 16 is formed, it is possible to form a highly accurate rewiring pattern 16.

Figure 4A:
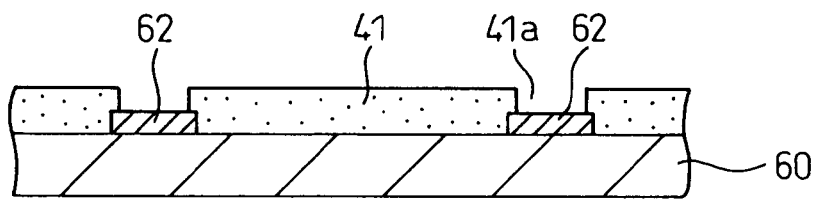
FIGS. 4(a) to 4(e) are schematic illustrations showing a method of forming a multi-layer wiring substrate by a method of forming wiring of the present invention.
Figure 4B:
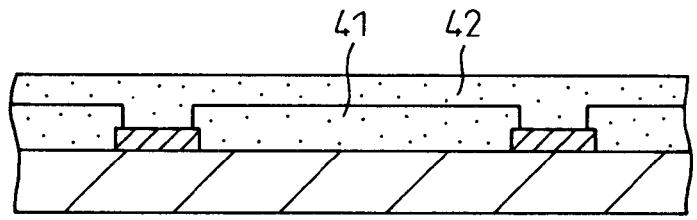
Figure 4C:
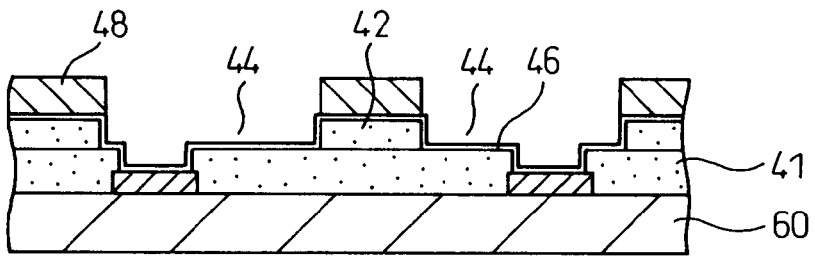

FIGS. 4(a) to 4(e) are views showing an example in which the method of forming wiring of the present invention is applied to manufacturing of a multi-layer wiring substrate. FIG. 4(a) is a view showing a state in which a surface, on which the wiring pattern 62 of the core substrate 60 is formed, is coated with the first insulating layer 41 and the opening 41a is formed at a position agreeing with the wiring pattern 62. FIG. 4(b) is a view showing a state in which the first insulating layer 41 is coated with the second layer 42. FIG. 4(c) is a view showing a state in which the second insulating layer 42 is exposed and developed so that the pattern groove 44 for forming the wiring pattern is formed.

Figure 4D:
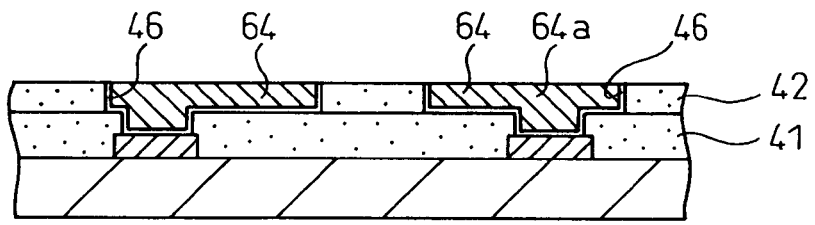

FIG. 4(d) is a view showing a state in which the wiring pattern 64a electrically connected with the wiring pattern 62 is formed in such a manner that the seed layer 46 is formed on a surface at the second insulating layer including an inner face of the pattern groove 44, the resist pattern is formed on a surface of the seed layer so that a portion in which the pattern groove 44 is formed can be exposed, electrolytic copper plating is conducted while the seed layer is being used as an electricity feeding layer for plating so that the pattern groove 44 is filled with the conductor 64 made of copper plating, and the resist pattern is removed and the exposed portion of the seed layer is removed by means of etching.

Figure 4E:
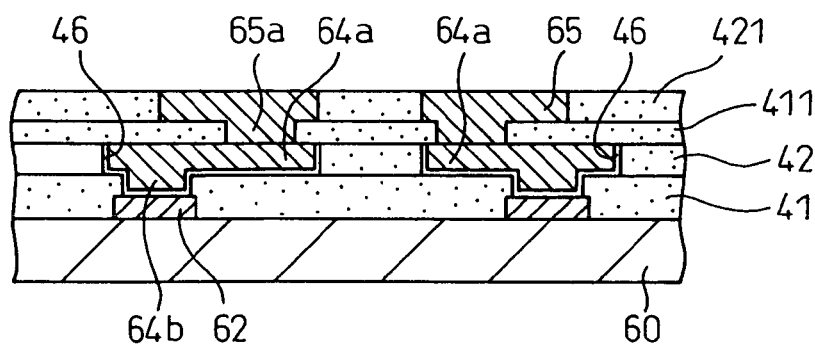
Figure 5:
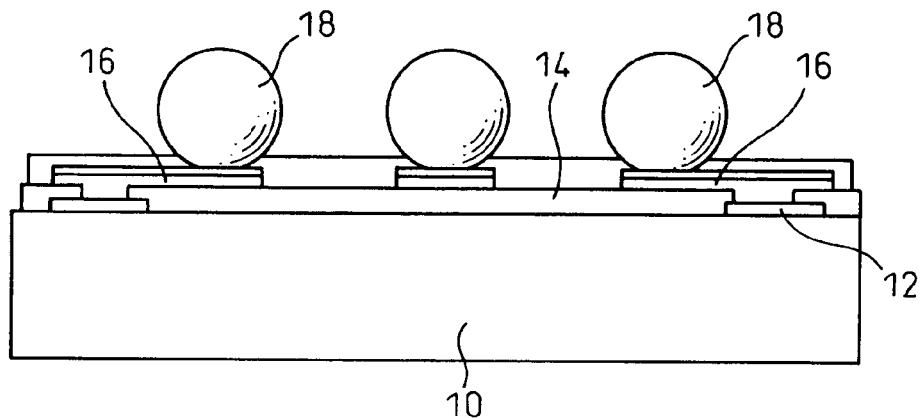
FIG. 5 is a sectional view showing a state in which a rewiring pattern is formed on an electrode terminal formation face of a semiconductor wafer.
Figure 6A:
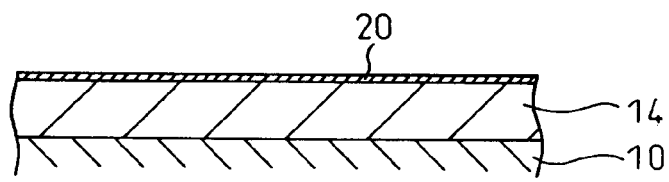
FIGS. 6(a) to 6(e) are schematic illustrations showing a method of forming a wiring pattern by the semi-additive method.
Figure 6B:
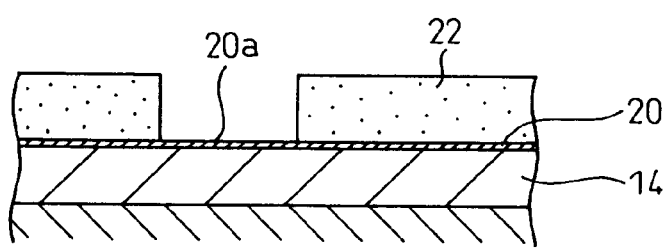
Figure 6C:
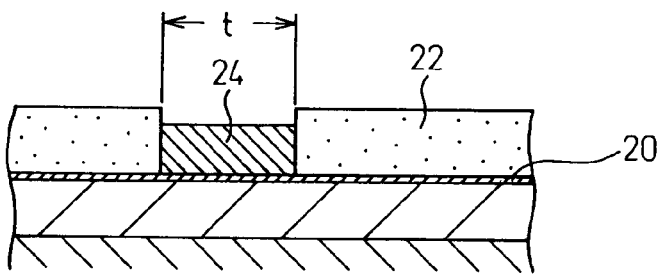
Figure 6D:
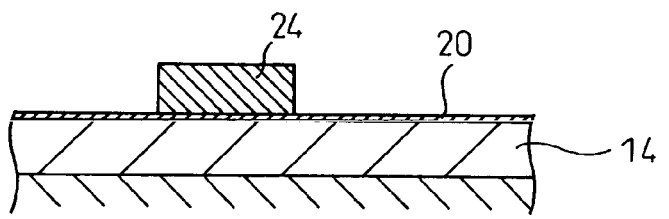
Figure 6E:
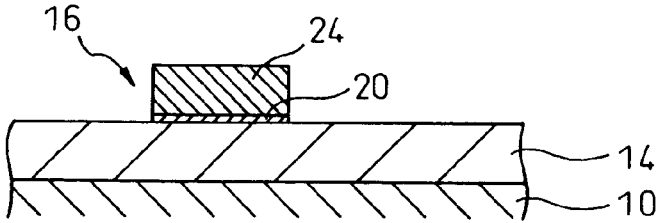
Figure 7A:
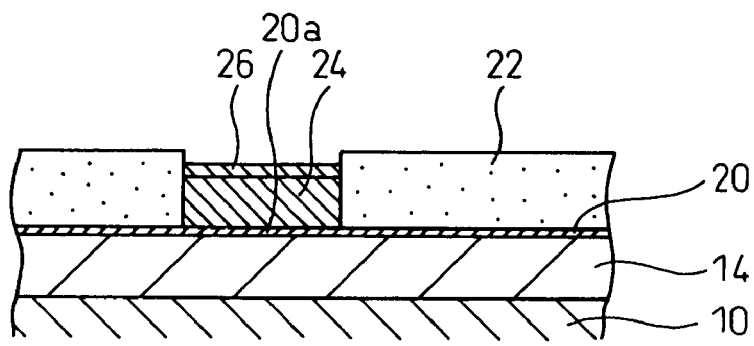
FIGS. 7(a) to 7(c) are schematic illustrations showing another method of forming a wiring pattern.
Figure 7B:
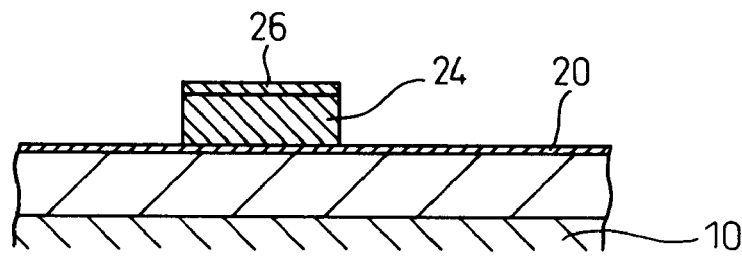
Figure 7C:
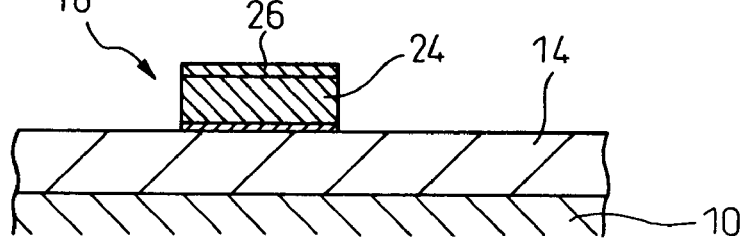
Figure 8A:
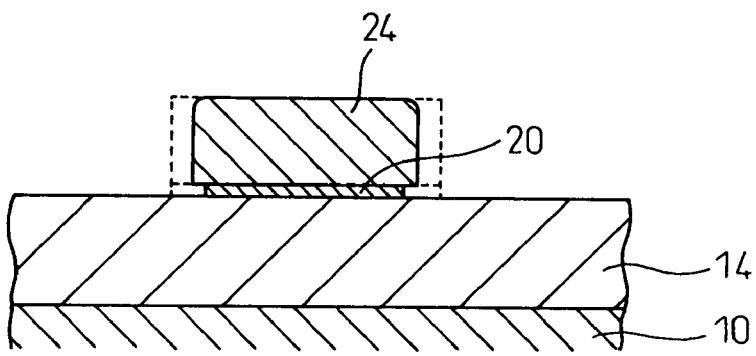
FIGS. 8(a) and 8(b) are schematic illustrations showing a state in which a side of a conductor, which becomes a wiring pattern, is etched.
Figure 8B:
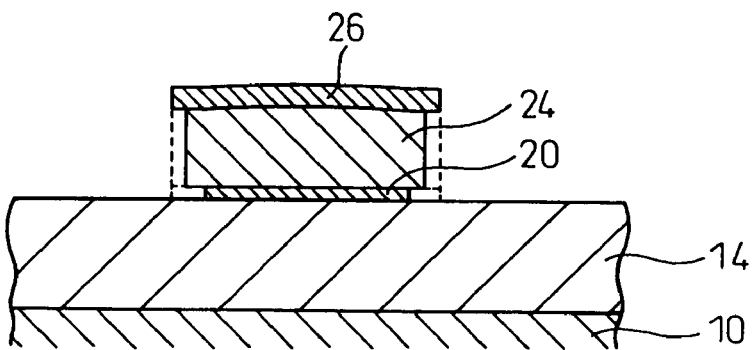

FIG. 4(e) is a view showing a state in which the upper layer wiring pattern 65 electrically connected with the wiring pattern 64a is formed by the same method as that described above. Reference numeral 411 is the first insulating layer provided when the wiring pattern 65 is formed, and reference numeral 421 is the second insulating layer. The wiring pattern 64a and the wiring pattern 65 are electrically connected with each other through the vias 65a, and the wiring pattern 64a and the wiring pattern 62 are electrically connected with each other through the vias 64b.

As described above, even if the multi-layer wiring substrate is formed, when the insulating layer on which the wiring pattern is formed is composed of two-layer structure and the pattern groove is formed on the second insulating layer so as to form the wiring pattern, it is possible to form a very fine wiring pattern with high accuracy.

According to the method of forming wiring of the present invention, as described above, it is possible to form a fine wiring pattern with very high accuracy. Therefore, the method of forming wiring of the present invention can be preferably applied when a semiconductor device or wiring substrate, the wiring pattern of which must be formed with high accuracy, is manufactured. Accordingly, it is possible to provide a highly accurate and reliable semiconductor device or wiring substrate.

It will be understood by those skilled in the art that the foregoing description relates to only some of preferred embodiments of the disclosed invention, and that various changes and modifications may be made to the invention without departing the spirit and scope thereof.

What is claimed is:

1. A method of forming a conductor wiring pattern, comprising:
    forming a first insulating layer on a surface of a substrate and forming a second, photosensitive insulating resin layer thereon;
    light-exposing and developing the second insulating layer to form pattern grooves, each having sidewalls and a bottom, so that the first insulating layer is exposed at the bottom of each pattern groove;
    forming a plating seed layer on the second insulating layer including inner surfaces of the pattern grooves and then forming a resist pattern on the plating seed layer except for portions of the pattern grooves of the second insulating layer so that the plating seed layer only on the sidewalls and the bottom of the pattern groove is exposed;
    filling the pattern grooves with a conductor having an upper surface by an electrolytic plating using the plating seed layer as a power supply layer;
    coating the upper surface of the conductor with a barrier layer; and
    removing the resist pattern and also removing by etching the plating seed layer exposed on the surface of the second insulating layer to form a wiring pattern consisting of the conductor remaining in the pattern grooves, while the upper surface of the conductor filled in the pattern grooves is protected by the barrier layer.

2. A method as set forth in claim 1, wherein a plurality of different metal layers are used, as the conductor, when the pattern grooves are filled with the conductor by the electrolytic plating.

3. A method as set forth in claim 2, wherein the plurality of different metal layers are at least two metal layers consisting of a copper base layer and a nickel barrier layer.

4. A method as set forth in claim 1, wherein:
the first insulating layer is composed of a photosensitive insulating resin; and
after the first insulating layer is light-exposed and developed to form an opening, through which a first wiring pattern formed on the substrate is to be electrically connected to a second wiring pattern to be formed on the first insulating layer, the first insulating layer is heated and hardened.

5. A method as set forth in claim 1, wherein a semiconductor wafer is used as the substrate, the semiconductor wafer has an electrode terminal forming surface, on which the first insulating layer and the second insulating layer are formed, and the wiring pattern, which is electrically connected with electrode terminals of the semiconductor wafer, is formed.

6. A method of forming a conductor wiring pattern, comprising:
forming a first insulating layer on a surface of a substrate and forming a second, photosensitive insulating resin layer thereon;
light-exposing and developing the second insulating layer to form one or more conductor paths having inner surfaces sidewalls and a lowest horizontal surface, so that the first insulating layer is exposed at the lowest horizontal surface of each of said one or more conductor paths;
forming a plating seed layer on the second insulating layer including said one or more conductor paths having inner surfaces sidewalls and a lowest horizontal surface and then forming a resist pattern on the plating seed layer except for said inner surfaces sidewalls and a lowest horizontal surface of said one or more conductor paths so that the seed layer is exposed only on said inner surfaces sidewalls and a lowest horizontal surface of said one or more conductor paths;
filling said one or more conductor paths with a conductor having an upper surface by an electrolytic plating using the plating seed layer as a power supply layer;
coating the upper surface of the conductor with a barrier layer; and
removing the resist pattern and also removing by etching the plating seed layer exposed on the surface of the second insulating layer to form a wiring pattern consisting of the conductor remaining said one or more conductor paths, while the upper surface of the conductor is protected by the barrier layer.

7. A method as set forth in claim 6, wherein said filling said one or more conductor paths with a conductor comprises filling said one or more conductor paths up to substantially the same thickness as that of the second insulating layer.

8. A method as set forth in claim 6, wherein said filling said one or more conductor paths with a conductor comprises filling said one or more conductor paths up to double the thickness of the second insulating layer.

9. A method as set forth in claim 6, wherein said removing the seed layer exposed on the surface of the second insulating layer comprises selectively removing portions of the seed layer on the surface of the second insulating layer so the conductor is protected by said inner surfaces defined by said sidewalls and a bottom of said one or more conductor paths and the second insulating layer of side portions from erosion.

* * * * *

UNITED STATES PATENT AND TRADEMARK OFFICE
CERTIFICATE OF CORRECTION

| | | |
|---|---|---|
| PATENT NO. | : 6,998,339 B2 | Page 1 of 1 |
| APPLICATION NO. | : 10/657193 | |
| DATED | : February 14, 2006 | |
| INVENTOR(S) | : Daisuke Ito | |

It is certified that error appears in the above-identified patent and that said Letters Patent is hereby corrected as shown below:

Column 8, Line 4, delete "at" and insert -- of -- therefor.
Column 10, Line 17, after "remaining" insert -- in --.

Signed and Sealed this

Twenty-fifth Day of July, 2006

JON W. DUDAS
*Director of the United States Patent and Trademark Office*